(12) United States Patent
Shimoyama et al.

(10) Patent No.: US 7,012,333 B2
(45) Date of Patent: Mar. 14, 2006

(54) LEAD FREE BUMP AND METHOD OF FORMING THE SAME

(75) Inventors: Masashi Shimoyama, Fujisawa (JP); Hiroshi Yokota, Fujisawa (JP); Rei Kiumi, Tokyo (JP); Fumio Kuriyama, Tokyo (JP); Nobutoshi Saito, Tokyo (JP)

(73) Assignee: Ebara Corporation, Tokyo (JP)

( * ) Notice: Subject to any disclaimer, the term of this patent is extended or adjusted under 35 U.S.C. 154(b) by 126 days.

(21) Appl. No.: 10/743,757

(22) Filed: Dec. 24, 2003

(65) Prior Publication Data

US 2004/0219775 A1 Nov. 4, 2004

(30) Foreign Application Priority Data

Dec. 26, 2002 (JP) ............................. 2002-378010

(51) Int. Cl.
*H01L 29/40* (2006.01)
(52) U.S. Cl. ...................................... 257/737; 257/772

(58) Field of Classification Search ................ 257/737, 257/778, 738
See application file for complete search history.

(56) References Cited

U.S. PATENT DOCUMENTS

| 6,228,322 B1 * | 5/2001 | Takeda et al. ............... 420/561 |
| 2003/0030149 A1 * | 2/2003 | Miura et al. ................ 257/772 |

* cited by examiner

*Primary Examiner*—Roy Potter
(74) *Attorney, Agent, or Firm*—Wenderoth, Lind & Ponack, L.L.P.

(57) ABSTRACT

The present invention relates to a lead-free bump with suppressed formation of voids, obtained by reflowing a plated film of Sn—Ag solder alloy having an adjusted Ag content, and a method of forming the lead-free bump. The lead-free bump of the present invention is obtained by forming an Sn—Ag alloy film having a lower Ag content than that of an Sn—Ag eutectic composition by plating and reflowing the plated alloy film.

5 Claims, 6 Drawing Sheets

20

As-plated

225 °C

230 °C

238 °C

LEAD FREE BUMP AND METHOD OF FORMING THE SAME

BACKGROUND OF THE INVENTION

1. Field of the Invention

The present invention relates to a lead-free bump and a method of forming the same, and more particularly to a lead-free bump with suppressed formation of voids, obtained by reflowing a plated film of Sn—Ag solder alloy having an adjusted Ag content, and a method of forming the lead-free bump, and also to a plating apparatus for forming such a lead-free bump.

2. Description of the Related Art

In surface mounting technology of semiconductor devices or the like, it is very important to carry out soldering with high reliability. Although an eutectic solder containing lead (Sn:Pb=63:37) has heretofore been used widely in soldering, in the light of environmental contamination and because of the problem of α-rays generation from lead, development of lead-free soldering is under way.

For example, lead-free soldering by means of printing or electroplating is being studied. With printing, however, there is a limit in its approach to fine pitches through the use of a metal mask. Electroplating is therefore becoming mainstream, for example, for the formation of wafer bumps.

In the case of forming wafer bumps by electroplating, a heating operation (reflowing) is usually carried out to make plated films into the form of balls. The reflow temperature is preferably as low as possible in order to avoid thermal damage to other parts that exist in the substrate. From this viewpoint, many developments of solder alloys have been directed to making the composition of an alloy closest possible to the eutectic composition of the alloy in order to make use of the eutectic point.

However, the formation of bumps by electroplating has the problem that upon reflowing of bumps, voids can be formed in the bumps. The formation of voids is particularly marked with bumps of an Sn—Ag alloy, lowering the reliability of the bumps.

SUMMARY OF THE INVENTION

There is, therefore, a need for the development of a means to form a lead-free Sn—Ag bump by electroplating without formation of voids upon reflowing, and it is an object of the present invention to provide such means.

As a result of studies to obtain a lead-free bump without formation of voids, it was discovered by the present inventors that when forming a bump by Sn—Ag solder alloy plating, the Ag content in the plated film has a great influence on the formation of voids. In particular, voids can be formed in a lead-free Sn—Ag bump upon reflowing when the Ag content of the bump is approximately equal to or higher than the Ag content of the Sn—Ag eutectic composition. As a result of further study, it has now been found that in order to securely prevent the formation of voids in a bump of Sn—Ag solder alloy, it is necessary to form the bump with a plated alloy film having a lower Ag content than that of the Sn—Ag eutectic composition (weight ratio Sn:Ag=96.5:3.5/Ag content, 3.5% by mass).

It has also been found that contrary to the expectation that a decrease in the Ag content of a plated alloy film from the Ag content of the Sn—Ag eutectic composition will incur a rise in the reflow temperature, the melting point of the alloy film does not increase significantly with a decrease in the Ag content, that is, it is not necessary to significantly raise the reflow temperature.

The present invention has been accomplished based on the above findings. Thus, the present invention provides a lead-free bump obtained by forming an Sn—Ag alloy film having a lower Ag content than that of an Sn—Ag eutectic composition by plating and reflowing the plated alloy film.

The present invention also provide a method of forming a lead-free bump comprising: carrying out Sn—Ag alloy plating on a portion on which a bump is formed while controlling the composition of a plating bath and electrodeposition conditions so that a plated Sn—Ag alloy film having a lower Ag content than that of the Sn—Ag eutectic composition is formed; and then reflowing the plated alloy film.

The present invention also provides a plating apparatus for forming a lead-free bump, comprising: a plating vessel for containing a plating solution having Ag ions and Sn ions; an anode; a holder for holding a workpiece and feeding electricity to the workpiece; an electrodeposition power source for feeding electricity to the anode and to the workpiece held by the holder; a replenishment mechanism for replenishing the plating solution with Ag ions and Sn ions; an analyzer for monitoring Ag ions and Sn ions; and a control mechanism for controlling, on a basis of analytical information from the analyzer, an Ag content in a plated Sn—Ag alloy film formed on a surface of the workpiece at a value lower than an Ag content of an Sn—Ag eutectic composition.

DETAILED DESCRIPTION OF THE PREFERRED EMBODIMENTS

Figure 1:
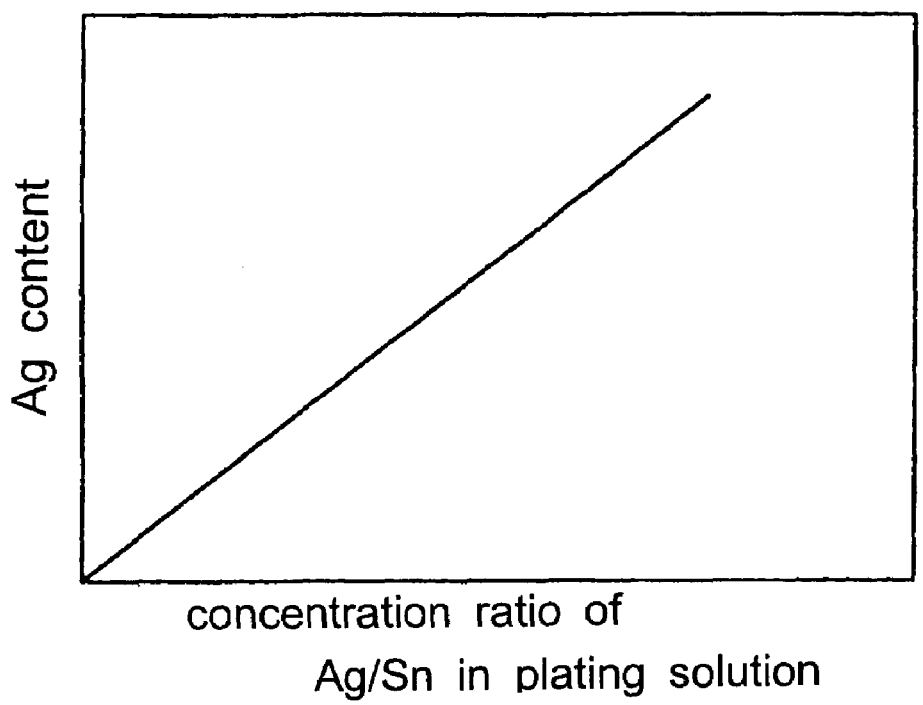
FIG. 1 is a diagram showing the relationship between the concentration ratio of Ag ion to Sn ion in an alloy plating solution and the Ag content in the plated film.

The lead-free bump of the present invention can be obtained by depositing a plated Sn—Ag alloy film by Sn—Ag alloy plating (hereinafter referred to simply as "alloy plating") carried out under such controlled electrodeposition conditions that the plated Sn—Ag alloy film has an Ag content which is lower than the Ag content of the Sn—Ag eutectic composition (i.e. 3.5 wt %), and then reflowing the plated Sn—Ag alloy film.

From the viewpoint of preventing the formation of voids, it may be sufficient merely to control the Ag content in the plated alloy film such that it is lower than the above-described upper limit. With the Ag content ranging from 2.6 to 3.5% by mass, however, voids could be formed in some cases. Thus, in order to completely avoid voids, the Ag content in the plated alloy film is preferably made not higher than 2.6% by mass.

Further, it is desirable from a practical viewpoint that the reflow temperature be not so high (for example, the maximum reflow temperature of not higher than 240° C.). For this purpose, it is preferred that the lower limit of the Ag content in the plated alloy film be made 1.6% by mass. Thus, in order to provide a practically desirable bump, the Ag content in the plated alloy film is preferably made within the range of 1.6 to 2.6% by mass.

Thus, according to the present invention, it is necessary to carry out plating while controlling the Ag content in the plated alloy film at a value lower than 3.5% by mass, preferably from 1.6 to 2.6% by mass.

Further, with respect to the lead-free bump obtained by reflowing the plated alloy film as described above, the level of α-rays emitted from the surface of the plated alloy film is preferably not higher than 0.02 cph/cm$^2$.

Lead has a plurality of isotopes, including natural radioactive elements. The isotopes of lead are intermediate products or final products in uranium or thorium decay series and emit α-rays in their decay processes. A-rays can act on semiconductor devices of a semiconductor integrated circuit and cause soft errors. Sn and other elements also contain such natural radioactive elements though in a slight amount. Thus, a lead-free Sn—Ag bump also emits α-rays, and it is important to suppress the emission of α-rays at a low level. By suppressing the emission of α-rays from the surface of the lead-free bump at a level of not higher than 0.02 cph/cm$^2$, soft errors in semiconductor integrated circuit devices due to the influence of α-rays can be prevented.

In general, the composition of deposited components in alloy plating is determined by the concentrations of the components in a plating solution and the electrodeposition conditions. Also in alloy plating according to the present invention, the Ag content in a plated alloy film can be made within the above-described range by adjusting the concentration ratio of Ag ion to Sn ion in an alloy plating solution, and controlling the electrodeposition conditions. In particular, the Ag content in a plated alloy film can be controlled by (a) changing the electrodeposition conditions while keeping the concentration ratio of Ag ion to Sn ion in a plating bath constant, or (b) by changing the concentration ratio of Ag ion to Sn ion in a plating bath while keeping the electrodeposition conditions constant.

Though the alloy plating solution generally contains, besides the ions of the metals forming an alloy, a complexing agent for stabilizing metal ions, a brightening agent for making the surface of the plated film beautiful and/or other additive(s), the Ag content in the plated alloy film is primarily determined by the concentration ratio of Ag ion to Sn ion in the alloy plating bath. Thus, a plated alloy film having a controlled Ag content can be obtained by finding a preferred range of the concentration ratio of Ag ion to Sn ion though experiments, and carrying out plating while keeping the concentration ratio within the preferred range. In fact, it has been confirmed that when carrying out alloy plating under fixed electrodeposition conditions, the Ag content in a plated alloy film is proportional to the concentration ratio of Ag ion to Sn ion in a plating solution, as schematically shown in FIG. 1.

Accordingly, a plated alloy film having a controlled Ag content can be obtained by immersing a workpiece in an alloy plating solution with a predetermined concentration ratio of Ag ion to Sn ion, and carrying out plating under constant electrodeposition conditions. By reflowing the plated alloy film, a bump without voids can be obtained.

The following is an example of an alloy plating solution usable in the present invention;

Composition:
Sn ion ($Sn^{2+}$): 10–100 g/L (preferably 35–50 g/L)
Ag ion ($Ag^+$): 0.3–8 g/L (preferably 0.6–4 g/L)
Methanesulfonic acid: 100 g/L It is known that, in alloy plating, the composition of deposited components varies depending on the electrodeposition conditions. Also in alloy plating according to the present invention, the Ag content in a plated alloy film can be changed by changing the electrodeposition conditions.

Alloy plating according to the present invention may be carried out in various manners using various types of electric currents, including direct current plating carried out by continuously applying a direct current, and an intermittent plating carried out by intermittently applying a direct current with periodical rest periods.

Figure 2:
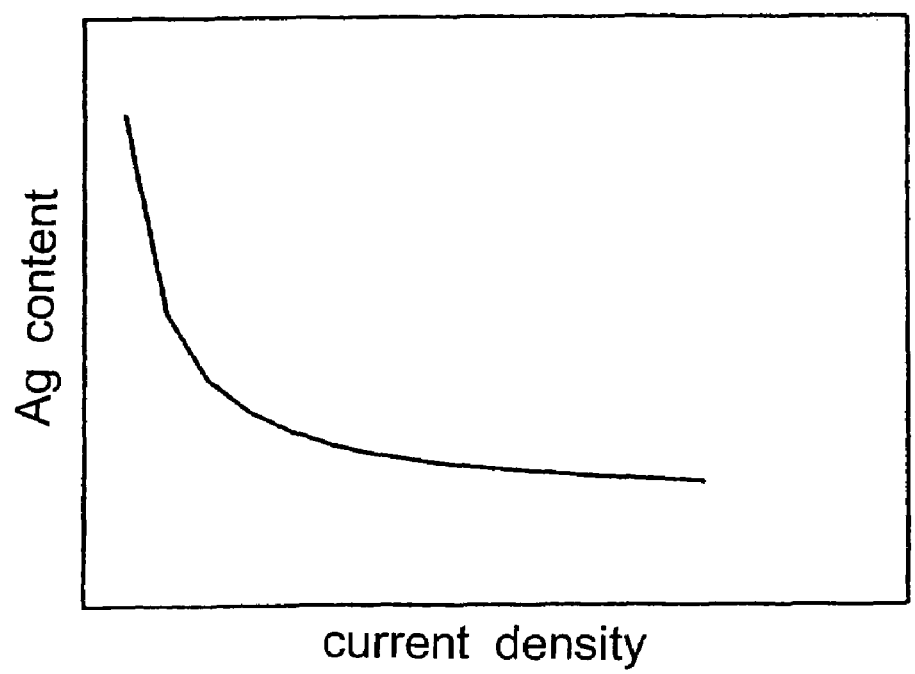
FIG. 2 is a diagram showing the relationship between the current density in plating and the Ag content in the plated film, as observed when the plating is carried out by continuously applying a direct current.

In the case of direct current plating in which a direct current is applied continuously during plating, the Ag content in the plated alloy film decreases with an increase in the current density, as schematically shown in FIG. 2. Preferable current conditions may be determined experimentally, and plating may be carried out while keeping the determined conditions. A preferred current density in direct current plating is about 10 to 100 mA/cm$^2$.

Figure 3:
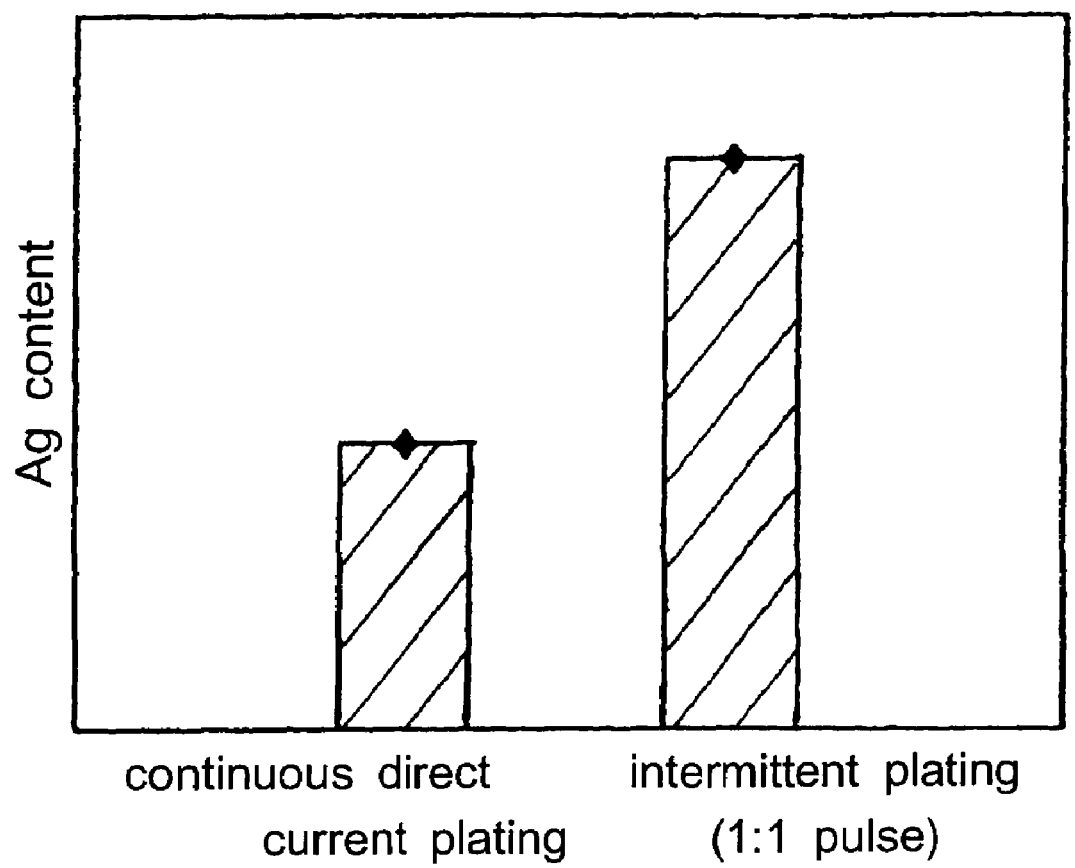
FIG. 3 is a diagram showing a difference in the Ag content in a plated film between a plated film obtained by plating carried out by continuously applying a direct current (continuous direct current plating) and a plated film obtained by plating carried out by intermittently applying a direct current (intermittent plating)

In the case of intermittent plating in which a direct current is applied intermittently with periodical rest periods, as schematically shown in FIG. 3, the plated alloy film has an Ag content which is different from the Ag content of a plated alloy film as obtained by applying the same direct current continuously. Also with intermittent plating, preferable conditions, such as an applied voltage, the proportion of rest time, etc. may be determined experimentally, and plating may be carried out while keeping the determined conditions. A preferred current density during application of electric current is about 10–200 mA/cm$^2$, and a preferred rest time (zero current) is ¹⁄₁₀–1 of application time.

Though each applied voltage in the above two types of plating varies depending upon conditions such as the intensity of current, the underlying material, the thickness of plating, the plating solution, the anode used, etc., it is preferably about 1 to 5 V.

There is no particular limitation on an apparatus for carrying out the above-described alloy plating, and a common dip type plating apparatus may be employed. For a practical operation, however, it is desirable to use an apparatus which takes account of a jig structure configured to the mechanical conditions of a workpiece, a stirring mechanism (paddle structure) for supplying metal ions uniformly and rapidly to the entire surface of a workpiece such as a wafer, the shape and size of a mask for equalizing the electric field distribution, a plating solution circulation system for removing foreign matter, preventing a change in the quality of a plating solution and supplying metal ions uniformly and rapidly to the entire surface of a workpiece, etc.

Figure 4:
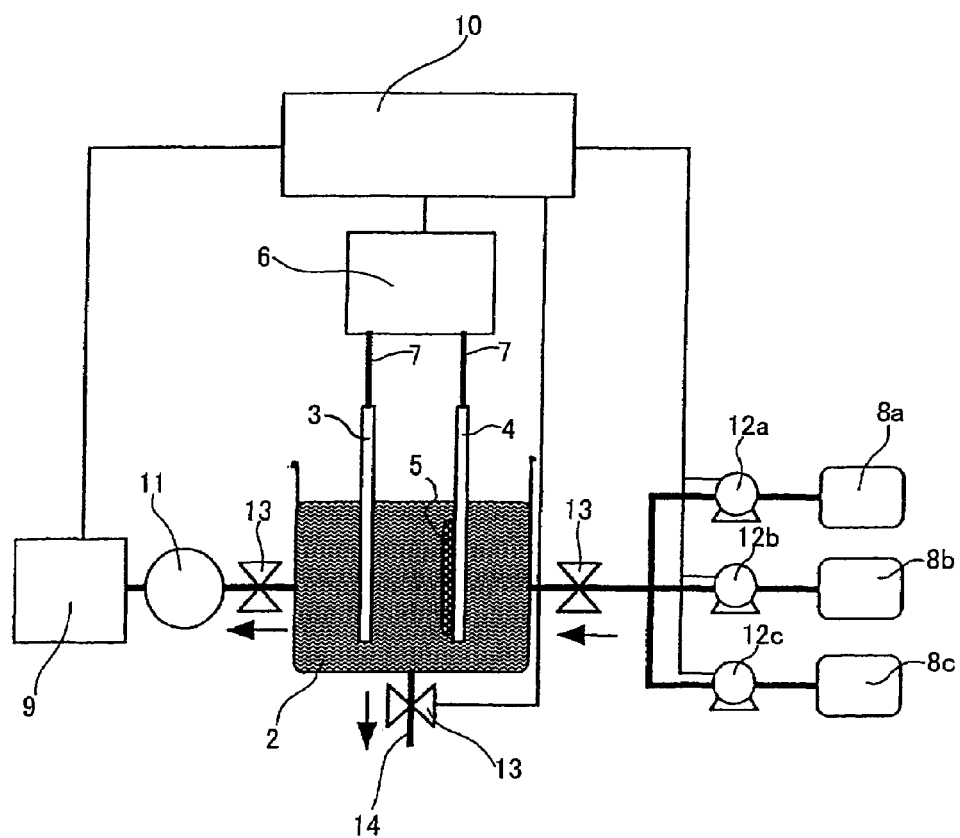
FIG. 4 is a diagram showing a plating apparatus according to an embodiment of the present invention.

Further, as described above, it is necessary to carry out alloy plating while adjusting the concentrations of Ag ions and Sn ions in a plating solution, and controlling the electrodeposition conditions. It is therefore preferred to use a plating apparatus which is provided with a replenishment mechanism for replenishing an alloy plating solution with Ag ions and Sn ions, an analyzer for monitoring Ag ions and Sn ions, and a control mechanical which, based on analytical information from the analyzer, adjusts the concentrations of Ag ions and Sn ions in the alloy plating solution and/or controls the electrodeposition conditions. FIG. 4 shows an example of such a plating apparatus.

In FIG. 4, reference numeral 1 denotes a plating apparatus, 2 denotes a plating vessel, 3 denotes an anode, 4 denotes a holder, 5 denotes a workpiece, 6 denotes an electrodeposition power source, 7 denotes conductive wire, 8a through 8c denote a replenishment mechanism, 9 denotes an analyzer, 10 denotes a control mechanism, 11 denotes an auto-sampler, 12a through 12c denote feed pumps, 13 denotes a shut-off valve, and 14 denotes a discharge outlet.

The analyzer 9 periodically or continuously analyzes and monitors a change in the concentrations of Ag ions and Sn ions, as an index for control of plating, which is due to consumption or loss of the ions during operation of the plating apparatus. An atomic absorption spectrometry device, for example, may be used as the analyzer 9.

The control mechanism 10, which comprises, for example, a computer for control, determines optimum replenishment amounts of Ag ions (solution), Sn ions (solution), etc. based on analytical information from the analyzer 9, and actuates the feed bumps 12a through 12c, which are connected to the replenishment mechanisms 8a through 8c, so as to add Ag ions (solution) and Sn ions (solution) to a plating solution.

The replenishment mechanisms 8a through 8c, besides the portion for replenishment of Ag ion solution and Sn ion solution, may additionally comprise a portion for replenishing water for adjustment of the composition of plating solution, or an additive.

The anode 3, the holder 4 and the plating vessel 2 are each made of a material whose emission of α-rays is low so that the amount of α-rays emitted from the surface of a plated Sn—Ag alloy film formed by the plating apparatus 1 is made not higher than 0.02 cph/cm$^2$. Thus, the amount of natural radioactive elements taken in a bump of the plated alloy film formed by plating is made low, so that the amount of α-rays emitted from the bump can be made at such a low level. This effectively suppresses soft errors in semiconductor integrated circuit devices due to the influence of α-rays.

The anode 3 may either be an insoluble anode or a soluble anode. It is possible with an insoluble anode to continue using it without a change. When an Sn soluble anode is used as the anode 3, Sn ions can be supplied from the anode to the plating solution during plating operation. This facilitates control of the plating solution and reduces operation for replenishment of metal ions.

The control mechanism 10 desirably controls the plating system under optimum electrodeposition conditions (the above-described current density and voltage application method) for a particular composition of plating solution, and should make at least one of control of the electrodeposition conditions and control of the concentrations of Ag ions and Sn ions by replenishment of the ions.

The actual deposition behavior of plating is influenced not only by the above-described concentration ratio of Ag ion to Sn ion in an alloy plating solution and the electrodeposition conditions but also by many other factors. For example, the Ag content in a plated alloy film can vary depending on the type of the additive(s) added in the plating solution. In most cases, however, the specific ingredients and their amounts of an additive are undisclosed as the additive manufacturer's know-how.

For forming bumps according to the present inventions, therefore, it is necessary to conduct experiments in advance with varying current densities in electroplating, voltage application methods and the concentration ratios of Ag ions to Sn ion in an alloy plating solution, and measure the contents of Ag in the various bumps formed. Based on the results of measurement, the optimum conditions for plating can be determined.

By carrying out plating under the optimum conditions thus determined, it becomes possible to stabilize the composition of the plating solution and stably form a bump having a desired Ag content.

Figure 5:
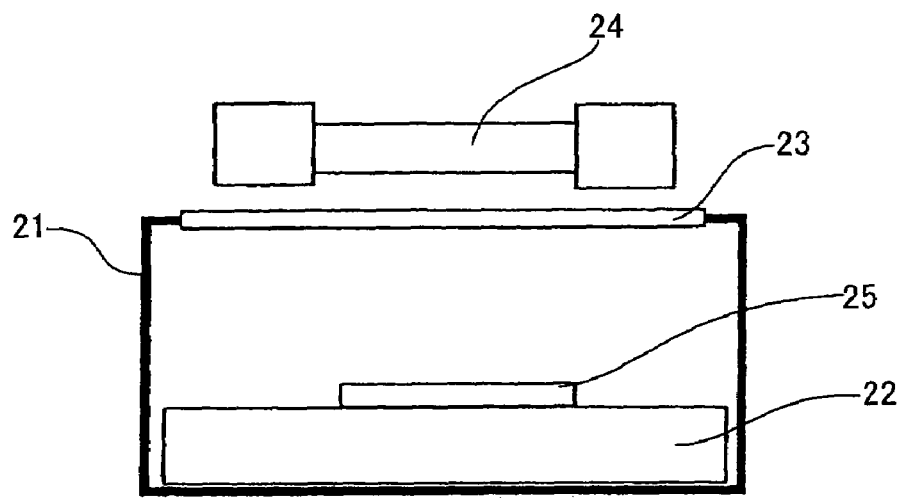
FIG. 5 is a diagram showing an infrared oven for use in reflowing.

The plated alloy film thus formed is then subjected to reflowing to form a bump. There flowing is carried out by heating the plated alloy film in an inert gas atmosphere (e.g. nitrogen or argon atmosphere) using, for example, the apparatus (infrared oven) shown in FIG. 5. In FIG. 5, reference numeral 20 denotes an infrared oven, 21 denotes a chamber, 22 denotes a stage, 23 denotes a silica glass window, 24 denotes an infrared lamp, and 25 denotes a workpiece.

The reflowing in this apparatus is carried out, for example, by setting the workpiece 25, which has undergone alloy plating, in the chamber 21, allowing nitrogen gas to flow into the chamber 21 at a rate of about 8 to 30 L/min to adequately carry out gas replacement, and then heating the workpiece 25 through the silica glass window 23 by the infrared lamp 24.

The reflow temperature is important for the formation of bumps according to the present invention. A bump may be formed on a printed circuit board, etc. Common electronic components are said to be heat-resistant to a temperature of about 240° C. The maximum temperature in the step of reflowing a plated alloy film formed by alloy plating should therefore be not higher than 240° C. Further, the melting point of an Sn—Ag solder is generally 221° C., and it is generally said that the minimum reflowable temperature is the melting point +10° C., and that the reflow temperature must be maintained for 15 to 45 seconds. Taking such requirements into consideration, the temperature conditions upon reflowing may be exemplified by: 231° C. for 30 seconds with the maximum temperature of 238° C.

The above-described lead-free bump of the present invention can be utilized, for example, as a ball-shaped bump on wiring pad in a mounting substrate.

In the formation of ball-shaped bumps, metal bond pads are first formed, and then a resist is applied on the substrate, with locations for bumps being left, to form a resist pattern. Next, plated Sn—Ag alloy films having a controlled Ag content are formed in the above-described manner. Thereafter, the resist is peeled off, and the alloy films are subjected to reflowing at a predetermined reflow temperature.

Any one of the formation of the metal bond pads, the formation of the resist pattern and the removal of the resist may be carried out by common methods in the art.

Further, the lead-free bump of the present invention can be used to form wiring pads on a variety of semiconductor substrates. In particular, a lead-free bump can be formed on a semiconductor substrate of a semiconductor device by the following steps (I) to (IV):

(I) Step of forming wiring pads on a semiconductor substrate of a semiconductor device (II) Step of forming a barrier metal on the wiring pads formed (III) Step of forming an Sn—Ag plating on the barrier metal (IV) Step of reflowing the Sn—Ag plating The semiconductor device used in step (I) includes an integrated circuit (IC) and the like. A known barrier metal may be used as the barrier metal formed on the wiring pads in step (II).

The following examples are provided to illustrate the present invention in greater detail and are not to be construed to be limiting the invention in any manner.

EXAMPLE 1

(1) Preparation of Sn—Ag Bump:

A resist was applied to a thickness of 120 μm on a wafer in such a manner that a number of holes having an opening size of 100 μm are formed, thereby preparing a sample. The plating area of the sample was 149.63 cm². Plating of the sample was carried out by the following steps under the following conditions.

(Plating Steps)

Degassing (10 min)→Pre-cleaning with 10% sulfuric acid (1 min)→Copper plating→Water-cleaning→Ni plating→Water-cleaning→Sn—Ag alloy plating (Plating Conditions)

(a) Cu plating

Plating bath composition:

| | |
|---|---|
| $Cu^{2+}$ | 220 g/L |
| $H_2SO_4$ | 200 g/L |
| HCl | 5 mL/L |
| Additive | 5 mL/L |

Plating temperature: 25° C.

Stirring: mechanical stirring (paddle stirring speed 10 m/min)

Circulation of plating solution: flow rate 2.5 L/min

Electrode: copper anode, interpolar distance about 7.5 mm, anode mask Ø 250 mm

Cathode current density (total current): 5 A/dm² (7.48 A)

Plating thickness: 2 μm (b) Ni Plating

Plating bath composition:

| | |
|---|---|
| $Ni(NH_2SO_4)·4H_2O$ | 450 g/L |
| $H_3BO_3$ | 30 g/L |
| $NiCl_2·6H_2O$ | 10 g/L |
| Additive | 2 mL/L |

Plating temperature: 50° C.

Stirring: mechanical stirring (paddle stirring speed 10 m/min)

Circulation of plating solution: flow rate 2.5 L/min

Electrode: nickel anode, interpolar distance about 75 mm, anode mask Ø 250 mm

Cathode current density (total current): 3 A/dm² (4.49 A)

Plating thickness: 3 μm (c) Sn—Ag Plating plating bath composition:

| | |
|---|---|
| $Sn^{2+}$ | 40 g/L |
| $Ag^+$ | 1.5 g/L |
| methanesulfonic acid | 100 g/L |
| Additive | 10 g/L |

[A 2:2:1 (weight ratio) mixture of polyoxyethylene surfactant, thiourea and cathechol]

Plating temperature: 25° C.

Stirring: mechanical stirring (paddle stirring speed 10 m/min)

Circulation of plating solution: flow rate 2.5 L/min

Electrode: titanium anode, interpolar distance about 7.5 mm, anode mask Ø 250 mm Cathode current density (total current): 10 A/dm² (14.9A), direct current plating Plating thickness: 140 μm (2) Reflowing After the plating described in (1) above, the resist was removed to expose the plated portions. The plated portions were reflowed by using an infrared oven as shown in FIG. 5. Temperature control of the infrared oven was carried out by placing a 2-inch silicon wafer with a thermocouple embedded in the outermost layer at the center (temperature measuring wafer made by SensArray Corporation) on the stage of the infrared oven. The sample to be reflowed was placed near the thermocouple of the silicon wafer. After carrying out pre-heating at 150 to 170° C. for 90 seconds, the sample was heated to a reflow temperature in 30 seconds. The reflow temperature was from the minimum reflowable temperature 231° C. to the maximum temperature 238° C. After maintaining the reflow temperature for 30 seconds, the sample was cooled.

The interior of the infrared oven had been replaced with nitrogen gas, and the heating was carried out while flowing nitrogen gas at a rate of 8 L/min. The infrared oven was employed because of its capability of rapid heating and rapid cooling.

(3) Composition Analysis of Bump

Figure 6A:
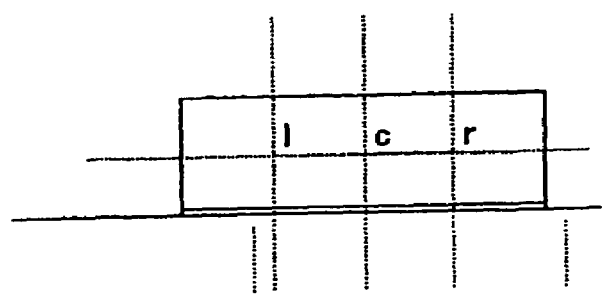
FIG. 6A is a diagram showing the sampling portions of sample before reflowing which are used for quantitative analysis of Ag in Example 1.
Figure 6B:
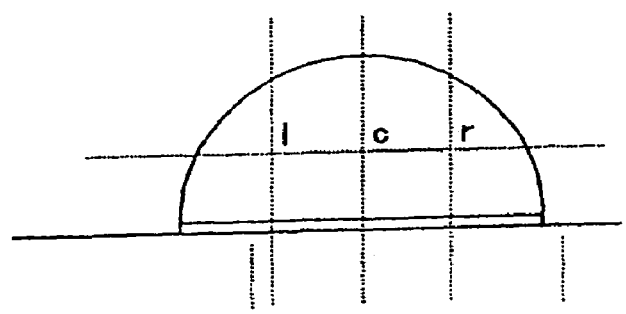
FIG. 6B is a diagram showing the sample portions of samples after reflowing which are used for quantitative analysis of Ag in Example 1.

The elemental composition of an Sn—Ag alloy bump was estimated in the following manner. The bump was embedded in a resin, and the bump was cut to expose a cut surface. After polishing the cut surface, elementary mapping was performed by EPMA (Electron Probe Microanalysis). Further, quantitative analysis of Ag was carried out in three sectional micro-areas (l, c, r) as shown in FIGS. 6A and 6B, each having an area of about 10 μm×10 μm, and the average of the measured valves was determined as the Ag content of the bump.

A rough measurement of elemental composition is possible, without the necessity of cutting a sample to expose a cut surface, by using a μ fluorescent X-ray analyzer. Further, it is also possible to dissolve the bumps in an acid and analyze the compositional distribution in the wafer by ICP-MS (Inductively Coupled Plasma Mass Spectrometer).

(4) Observation of the Shape of Bump

Figure 7A:
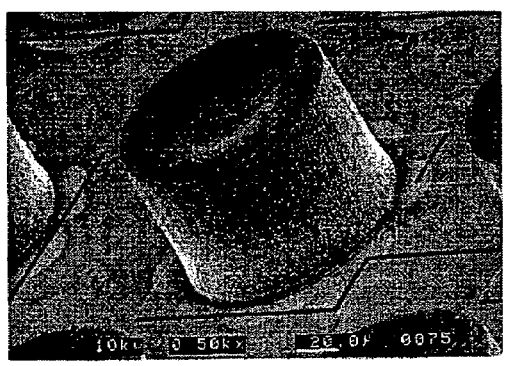
FIG. 7A is an SEM photograph of a bump before reflowing obtained in Example 1.
Figure 7B:
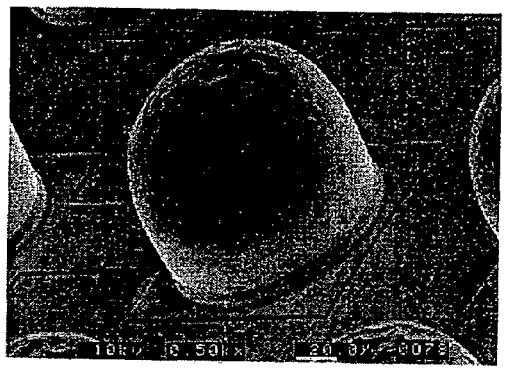
FIG. 7B is an SEM photograph of the bump shown in FIG. 7A but after reflowing at 225° C.
Figure 7C:
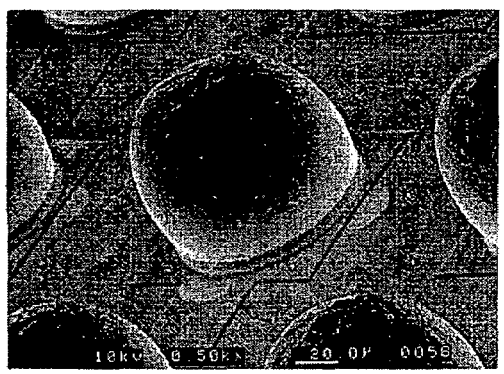
FIG. 7C is an SEM photograph of the bump shown in FIG. 7A but after reflowing at 230° C.
Figure 7D:
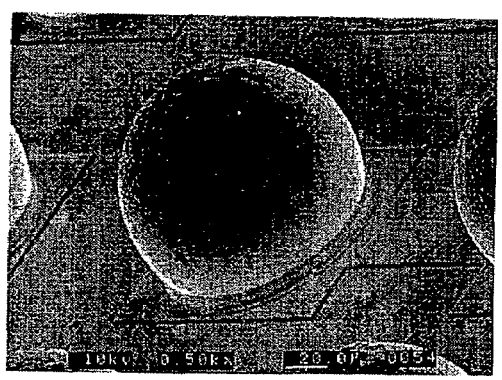
FIG. 7D is an SEM photograph of the bump shown in FIG. 7A but after reflowing at 238° C.

After the Sn—Ag alloy plating and the subsequent removal of the resist, the plated portions and the bumps after reflowing at various temperatures were observed under an SEM. FIG. 7A shows an SEM photograph of a bump before reflowing, FIG. 7B shows an SEM photograph of a bump after reflowing at 225° C., FIG. 7C shows an SEM photograph of a bump after reflowing at 230° C., and FIG. 7D shows an SEM photograph of a bump after reflowing at 238° C.

(5) Observation of Voids

Figure 8:
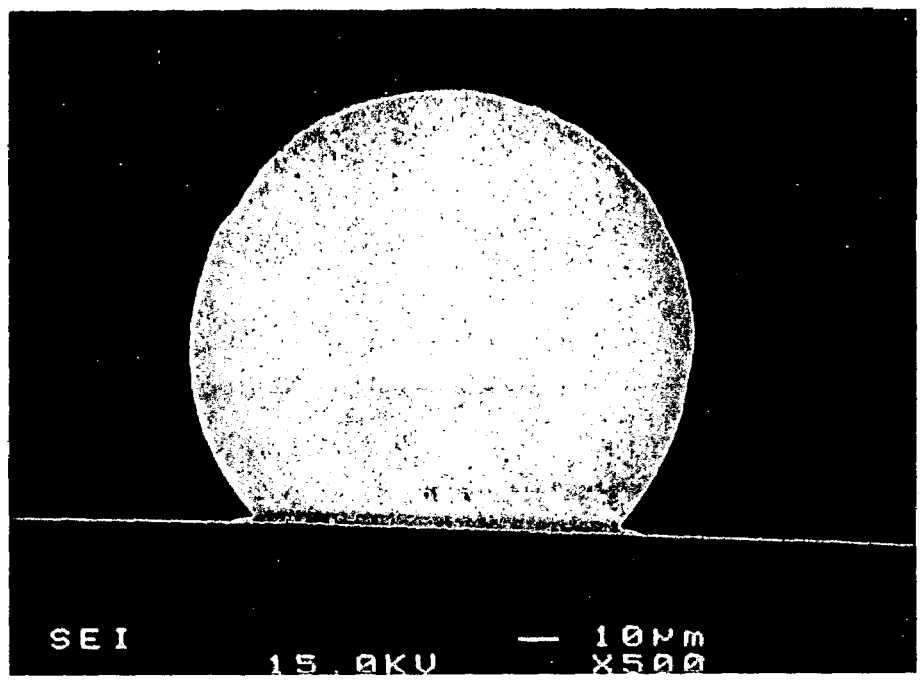
FIG. 8 is an SEM photograph of the cross-section of a bump formed by subjecting a plated Sn—Ag alloy film having an Ag content of 2.6% by mass to reflowing at 238° C.
Figure 9:
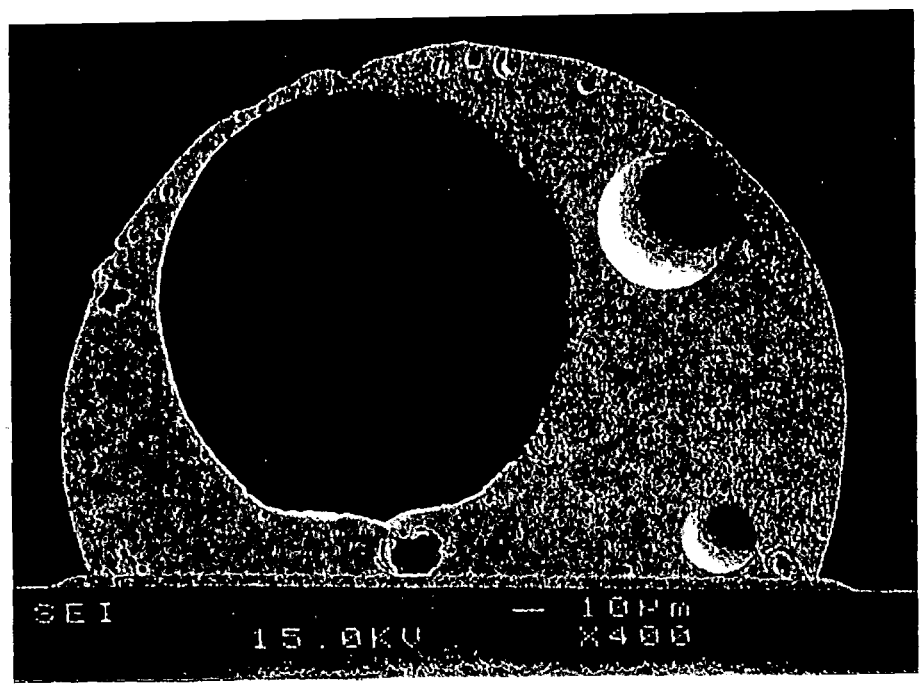
FIG. 9 is an SEM photograph of the cross-section of a bump formed by subjecting a plated Sn—Ag alloy film having an Ag content of 3.4% by mass to reflowing at 238° C.

A cut surface of a bump after reflowing at 238° C., was observed under an SEM. The observation was carried out after embedding the wafer in a resin, cutting the bump and polishing the cut surface. As a result, as shown in FIG. 8, no void was observed in a plated alloy film (bump) according to the present invention, having an Ag content of 2.6% by mass. In contrast, voids were formed in a bump of plated alloy film having an Ag content of 3.4% by mass, as shown in FIG. 9.

EXAMPLE 2

Alloy plating was carried out with various proportions of Ag to the total metal in an alloy plating solution, various current densities upon plating and various current application methods, and the respective plated alloy films were subjected to reflowing at 238° C. For the bump thus obtained, measurement of the Ag content and observation of the shape of bump and the presence of voids were carried out in the same manner as in Example 1. The results are shown in table 1.

TABLE 1

| Plating solution Ag/Sn (%) | Plating conditions Current density (A/dm$^2$) | Voltage application method | Bump Ag content (wt %) | Void present (x) absent (o) | Ball formation at 238° C. |
|---|---|---|---|---|---|
| 4.3 | 3 | DC | 5.2 | x | o |
| 4.4 | 3 | DC | 6.4 | x | o |
| 4.4 | 20 | CHOP | 4.0 | x | o |
| 4.3 | 3 | DC | 7.7 | x | o |
| 4.3 | 20 | CHOP | 5.1 | x | o |
| 1.3 | 3 | DC | 1.8 | o | o |
| 1.3 | 8 | DC | 0.9 | o | x |
| 1.3 | 20 | CHOP | 1.4 | o | x |
| 2.2 | 3 | DC | 3.4 | x | o |
| 2.2 | 20 | CHOP | 2.1 | o | o |
| 4.1 | 3 | DC | 4.9 | x | o |
| 3.1 | 20 | CHOP | 2.9 | o | o |
| 3.1 | 10 | CHOP | 3.6 | x | o |
| 3.1 | 3 | DC | 5.0 | x | o |
| 3.2 | 3 | DC | 5.8 | x | o |
| 3.2 | 20 | CHOP | 2.7 | x | o |
| 2.3 | 3 | DC | 3.5 | x | o |
| 2.3 | 20 | CHOP | 2.6 | o | o |

Note:
DC denotes direct current plating, and CHOP denotes intermittent plating

As apparent from the results shown in Table 1, voids are not formed in a bump (plated alloy film) when the Ag content is 2.9% or lower. Especially when the Ag content is from 1.8 to 2.6%, the plated alloy film can be transformed into a ball at the maximum reflow temperature 238° C. without formation of voids, providing a highly practical lead-free bump.

Lead-free bumps according to the present invention are free of voids, and are of a desirable ball shape that can be formed at a relatively low reflow temperature. Further, those bumps do not contain lead, and thus do not cause malfunction of an integrated circuit due to the emission of α-rays nor environmental contamination.

Lead-free bumps according to the present invention can therefore be widely used in surface mounting technology (SMT) of semiconductor devices, etc. and enable a reliable soldering despite their no inclusion of lead.

What is claimed is:

1. A lead-free bump obtained by forming an Sn—Ag alloy film having a lower Ag content than that of an Sn—Ag eutectic composition by plating and reflowing the plated alloy film.

2. The lead-free bump according to claim 1, wherein the Ag content in the plated Sn—Ag alloy film is 1.6 to 2.6% by mass.

3. The lead-free bump according to claim 1, wherein the maximum temperature of the reflowing the plated alloy film is not higher than 240° C.

4. The lead-free bump according to claim 1, wherein the Ag content in the plated alloy film is adjusted to be lower than the Ag content of the Sn—Ag eutectic composition by controlling a composition of a plating bath and electrodeposition conditions.

5. The lead-free bump according to claim 1, wherein the amount of α-rays emitted from a surface is not higher than 0.02 cph/cm$^2$.

* * * * *